(12) United States Patent
Masuda et al.

(10) Patent No.: US 9,640,321 B2
(45) Date of Patent: May 2, 2017

(54) CERAMIC ELECTRONIC COMPONENT WITH METAL TERMINAL

(71) Applicant: TDK Corporation, Minato-ku, Tokyo (JP)

(72) Inventors: Sunao Masuda, Tokyo (JP); Katsumi Kobayashi, Tokyo (JP); Akitoshi Yoshii, Tokyo (JP)

(73) Assignee: TDK Corporation, Tokyo (JP)

( * ) Notice: Subject to any disclaimer, the term of this patent is extended or adjusted under 35 U.S.C. 154(b) by 6 days.

(21) Appl. No.: 14/536,032

(22) Filed: Nov. 7, 2014

(65) Prior Publication Data

US 2015/0131202 A1     May 14, 2015

(30) Foreign Application Priority Data

Nov. 8, 2013  (JP) ................................ 2013-232463

(51) Int. Cl.
*H01G 2/10*   (2006.01)
*H01G 4/30*   (2006.01)
*H01G 4/38*   (2006.01)
*H01G 2/06*   (2006.01)
*H01G 4/232*  (2006.01)

(Continued)

(52) U.S. Cl.
CPC ............. *H01G 2/106* (2013.01); *H01G 2/06* (2013.01); *H01G 4/232* (2013.01); *H01G 4/30* (2013.01); *H01G 4/38* (2013.01); *H01G 4/12* (2013.01); *H05K 3/3426* (2013.01); *H05K 2201/1053* (2013.01); *H05K 2201/10537* (2013.01);

(Continued)

(58) Field of Classification Search
CPC ........ H01G 42/106; H01G 2/06; H01G 4/232; H01G 4/38; H01G 4/30; H01G 4/12; H05K 2201/1053; H05K 3/3426
See application file for complete search history.

(56) References Cited

U.S. PATENT DOCUMENTS 4,004,200 A  *  1/1977  Johanson ............... H01G 4/248
                                            361/310
4,346,429 A  *  8/1982  DeMatos ............... H01G 4/248
                                            361/275.1

(Continued)

FOREIGN PATENT DOCUMENTS

JP          05326341 A   * 12/1993
JP       2000-235931 A      8/2000

*Primary Examiner* — David M Sinclair
(74) *Attorney, Agent, or Firm* — Arent Fox LLP

(57) ABSTRACT

A ceramic electronic component with metal terminals comprising a chip component of approximately parallelepiped shape having a pair of terminal electrodes, and a pair of metal terminal parts provided in accordance with the terminal electrodes. The terminal electrode is formed by wrapping around a part of side faces from an end face of the chip component. The metal terminal part comprises a connecting part connecting to the terminal electrode and including a connecting face extending approximately parallel to the end face, plurality of joint parts connecting to the connecting part and including a joint face extending in a different direction of the connecting face, and plurality of mounting parts connecting to the joint parts and including a mounting part upper face extending approximately parallel to any one of the side faces which is different direction of the joint face by taking predetermined spaces.

23 Claims, 6 Drawing Sheets

(51) Int. Cl.
*H01G 4/12* (2006.01)
*H05K 3/34* (2006.01)

(52) U.S. Cl.
CPC .............. *H05K 2201/10636* (2013.01); *H05K 2201/10946* (2013.01); *Y02P 70/611* (2015.11)

(56) References Cited

U.S. PATENT DOCUMENTS

| | | | | |
|---|---|---|---|---|
| 6,191,933 | B1* | 2/2001 | Ishigaki | H01G 4/232 |
| | | | | 361/309 |
| 6,473,291 | B1* | 10/2002 | Stevenson | H01G 4/228 |
| | | | | 361/301.4 |
| 6,781,816 | B2* | 8/2004 | Togashi | H01G 4/232 |
| | | | | 361/301.1 |
| 7,331,799 | B1* | 2/2008 | Lee | H01G 2/06 |
| | | | | 361/306.3 |
| 8,873,219 | B2* | 10/2014 | Perea | H01G 4/30 |
| | | | | 361/301.4 |
| 2008/0239621 | A1* | 10/2008 | Tajuddin | H01G 2/06 |
| | | | | 361/306.1 |
| 2014/0063687 | A1* | 3/2014 | Saito | H01G 4/228 |
| | | | | 361/308.1 |

* cited by examiner

CERAMIC ELECTRONIC COMPONENT WITH METAL TERMINAL

CROSS REFERENCE TO RELATED APPLICATIONS

This application claims priority to Japanese Patent Application No. 2013-232463, filed Nov. 8, 2013, the disclosure of which is hereby incorporated by reference in its entirety.

BACKGROUND OF THE INVENTION

1. Field of the Invention

The present invention relates to a ceramic electronic component with metal terminals comprising a chip component and metal terminals installed therewith.

2. Background Art

As for the ceramic electronic component such as ceramic capacitor or so, other than the usual chip component which is singularly and directly surface mounted to the base board or so, those installed with the metal terminals to the chip component is proposed as well. The ceramic electronic component installed with the metal terminals is reported to have an effect to relieve the deformation stress to the chip component applied from the base board and to protect the chip component from the impact or so; thus it is used in the filed in which a durability and a reliability are demanded.

As the metal terminal parts of the conventional ceramic electronic components comprises the mounting part which is bended perpendicularly from the face which is parallel to the end face of the chip component, and mounting the mounting part to the mounting base board by soldering is proposed (refer to Patent document 1)

[Patent document 1] JP Patent Application Laid Open No. 2000-235931

However, the conventional ceramic electronic component comprising the mounting part which is bended perpendicularly from the face which is parallel to the end face of the chip component had a problem that the vibration generated in the chip component easily transfers the mounting board via to the metal terminal and causes the squealing noise.

SUMMARY OF THE INVENTION

The Problems to be Solved by the Invention

The present invention was achieved in view of such circumstance and the object is to provide the ceramic electronic component capable of preventing the vibration generated in the chip component from transferring to the mounting base board via the metal terminals.

In order to achieve the above object, the ceramic electronic component according to the present invention is a ceramic electronic component with metal terminals comprising a chip component of approximately parallelepiped shape having a pair of terminal electrodes, and a pair of metal terminal parts provided in accordance with said terminal electrodes, wherein said terminal electrode is formed by wrapping around a part of side faces from an end face of said chip component, and said metal terminal part comprises a connecting part connecting to said terminal electrode and including a connecting face extending approximately parallel to said end face, plurality of joint parts connecting to said connecting part and including a joint face extending in a different direction of said connecting face, and plurality of mounting parts connecting to said joint parts and including a mounting part upper face extending approximately parallel to any one of said side faces which is different direction of said joint face by taking predetermined spaces.

Also, for example, said mounting part upper face may be spaced apart with respect to said side face facing the mounting part upper face.

The metal terminal part of the ceramic electronic component according to the present invention has a joint part in between the mounting part and the connecting part which connects to the terminal electrodes of the chip component, and a predetermined space is provided in between the mounting part and the chip component. Therefore, while being compact, it can secure a longer passage of the vibration to the mounting part from the chip component compared to the conventional ones, and also by spreading the vibration direction when transferring the vibration via the joint part, the vibration can be suppressed from transferring to the mounting base board via the metal terminals from the chip component. Thus, such ceramic electronic component can reduce the squealing noise when using. Also, as the metal terminal parts comprise plurality of joint parts and the mounting parts, thereby the transmission route is spread and becomes short thus the ESL can be reduced.

Also, for example, said connecting part is connected to said connecting face, and it may comprise at least a pair of fitting arm parts holding said side face of said chip component in between.

Also, for example, a pair of said fitting arm parts may hold the side face approximately parallel to said mounting part upper face in between.

In such ceramic electronic component, the fitting arm parts holds the side face of the chip component in between thereby the metal terminal parts and the chip components are fixed, hence there is no risk that such fixed metal terminal parts and the chip components will be disengaged due to the heat transferred to the bonding portion when mounting said ceramic electronic component. Further, unlike the conventional arts, there is no need to use the high temperature solder for bonding the metal terminal parts and the chip component, thus the material having environmental load can be suppressed from being used. Note that, at the arm inner face which is the face facing the chip component in the fitting arm parts, the inner side projection part engaging to the chip component is preferably formed.

Also, for example, the ceramic electronic component according to the present invention may comprise plurality of said chip components aligned along the face approximately parallel to said mounting part upper face.

By aligning plurality of chip components along the face parallel to the mounting part upper face, the ceramic electronic components having high capacitance with low height can be realized. Also, at the metal terminal part, the electric current direction in the connecting part will be spread into many directions thus the transmission route can be made short, hence according to the ceramic electronic component, low ESL can be realized.

Also, for example, said connecting part may comprise a pair of first fitting arm parts connected to said connecting face and holding said side faces of one of said chip components, and a pair of second fitting arm parts connected to said connecting face by taking a predetermined space with respect to said first fitting arm part and holding said side face of one of other said chip components in between.

By having the first fitting arm part and the second fitting arm part which connect to the connecting face by taking predetermined space, each fitting arm part can independently hold the chip components respectively. Therefore, for such ceramic electronic component, even if there is a size variation for the chip components being held, the first and the second fitting arm parts can securely hold each chip component.

Also, for example, said joint face may be placed by taking predetermined space against one other side face adjacent to said side a face which is parallel to said mounting part upper face.

Also, for example, at plurality of said joint parts, one joint parts including the joint face facing one side face perpendicular to said mounting part upper face among said side faces, and one other joint parts including the joint face facing one other side faces perpendicular to said mounting part upper face among said side faces may be included.

By taking a predetermined space between the joint face and the side face of the chip component, even if there is a size variation of the chip components, the metal terminal parts can be stably installed to the chip component. Further, it can suppress the transfer of the vibration from the chip component thereby the squealing noise can be suppressed. Further, since the space between the mounting part and the lower side face of the chip component will be larger, it can prevent the problem of the squealing noise from worsening which is caused by the solder adhering over the mounting part and the chip component when mounting.

Also, for example, plurality of said mounting parts may extend towards the portion facing said chip component from the connecting portion with said joint part.

Also, for example, plurality of said mounting parts includes one mounting part connecting to the joint part including the joint face facing said one side faces, and one other mounting part connecting to the joint part including the joint face facing said one other side faces; and said one mounting part and said one other mounting part may extend to the direction facing each other.

Such ceramic electronic component has a shape that the mounting part extends to a lower direction of the chip component, thus the area needed for mounting can be reduced, and the high density mounting can be realized.

Also, for example, said chip component may be a multilayered chip component having a stacking direction approximately parallel with respect to said mounting part upper face.

Also, for example, the element of said chip component may be a multilayered body having a dielectric layer and an internal electrode layer.

The ceramic electronic component according to the present invention can reduce the problem of having a longer transmission route when the number of the stacking increases, and it can also suppress the ESL can be suppressed.

Also, for example, said end face of said chip component and said connecting face of said metal terminal part may be bonded by nonconductive adhesive agent.

By using the nonconductive adhesive agent, higher adhesiveness can be obtained compared to the conductive adhesive agent including the conductive component such as metal filler or so, thus the adhesive strength can be enhanced between the chip component and the metal terminal part.

BRIEF DESCRIPTION OF DRAWINGS

Herein below, the present invention will be explained based on the embodiment shown in the figures.

DESCRIPTION OF THE PREFERRED EMBODIMENTS

Herein below, the embodiment of the present invention will be explained based on the figures.

First Embodiment

Figure 1:
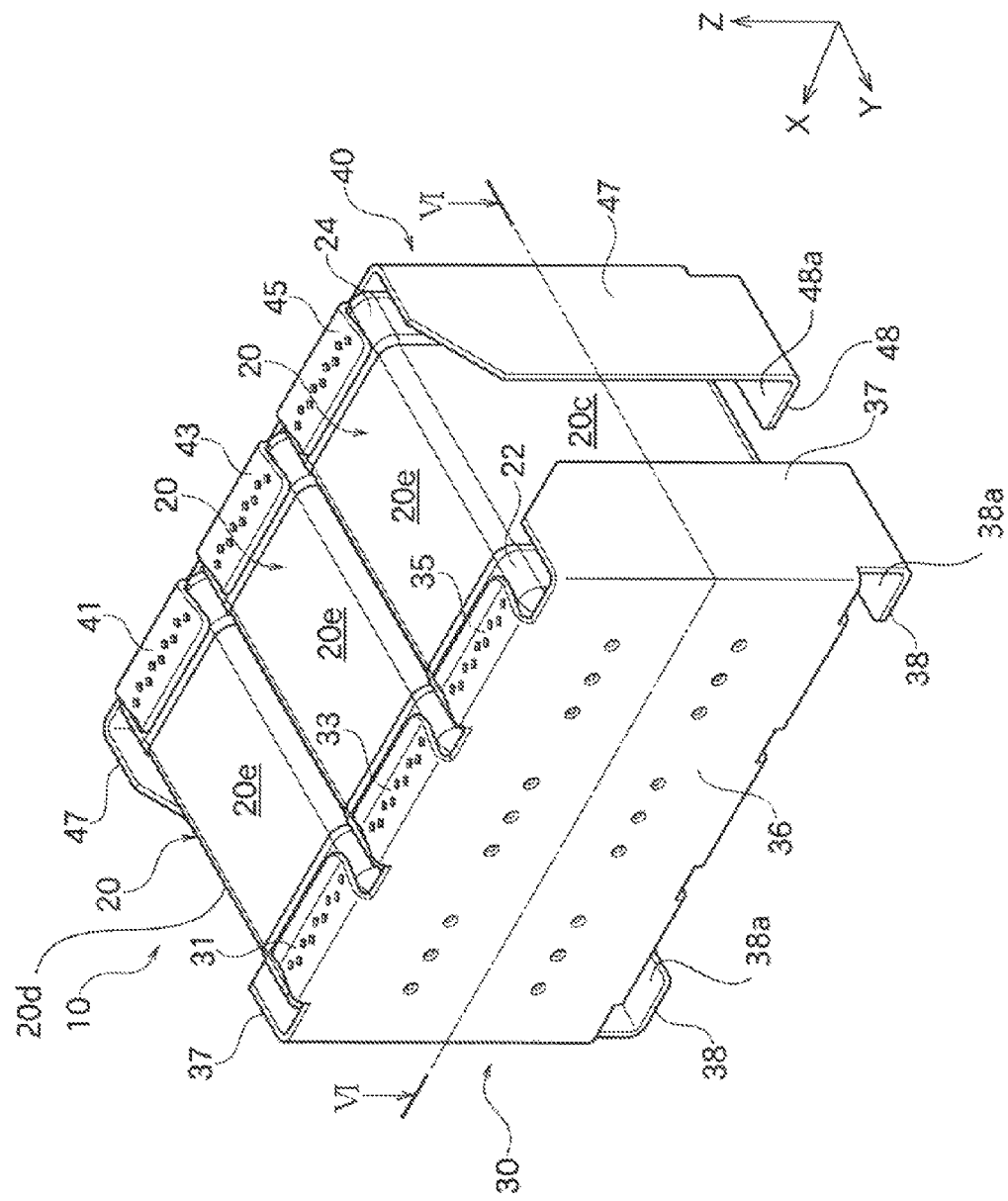
FIG. 1 is the schematic perspective view showing the ceramic electronic component according to the first embodiment of the present invention.

FIG. 1 is a schematic perspective view showing the ceramic capacitor 10 according to the first embodiment of the present invention. The ceramic capacitor 10 comprises three chip capacitors 20 having a pair of electrodes 22, 24 comprising a first terminal electrode 22 and a second terminal electrode 24, and a pair of metal terminals 30, 40 provided in accordance with the terminal electrodes 22, 24 of the chip capacitor 20.

Note that, for the explanation of each embodiment, the ceramic capacitor of which the metal terminal parts 30, 40 are installed to the chip capacitor 20 will be used as an example, however the ceramic electronic component of the present invention is not to be limited thereto, and it may be those which the metal terminal parts 30, 40 are installed to the chip components other than the capacitor.

Figure 5:
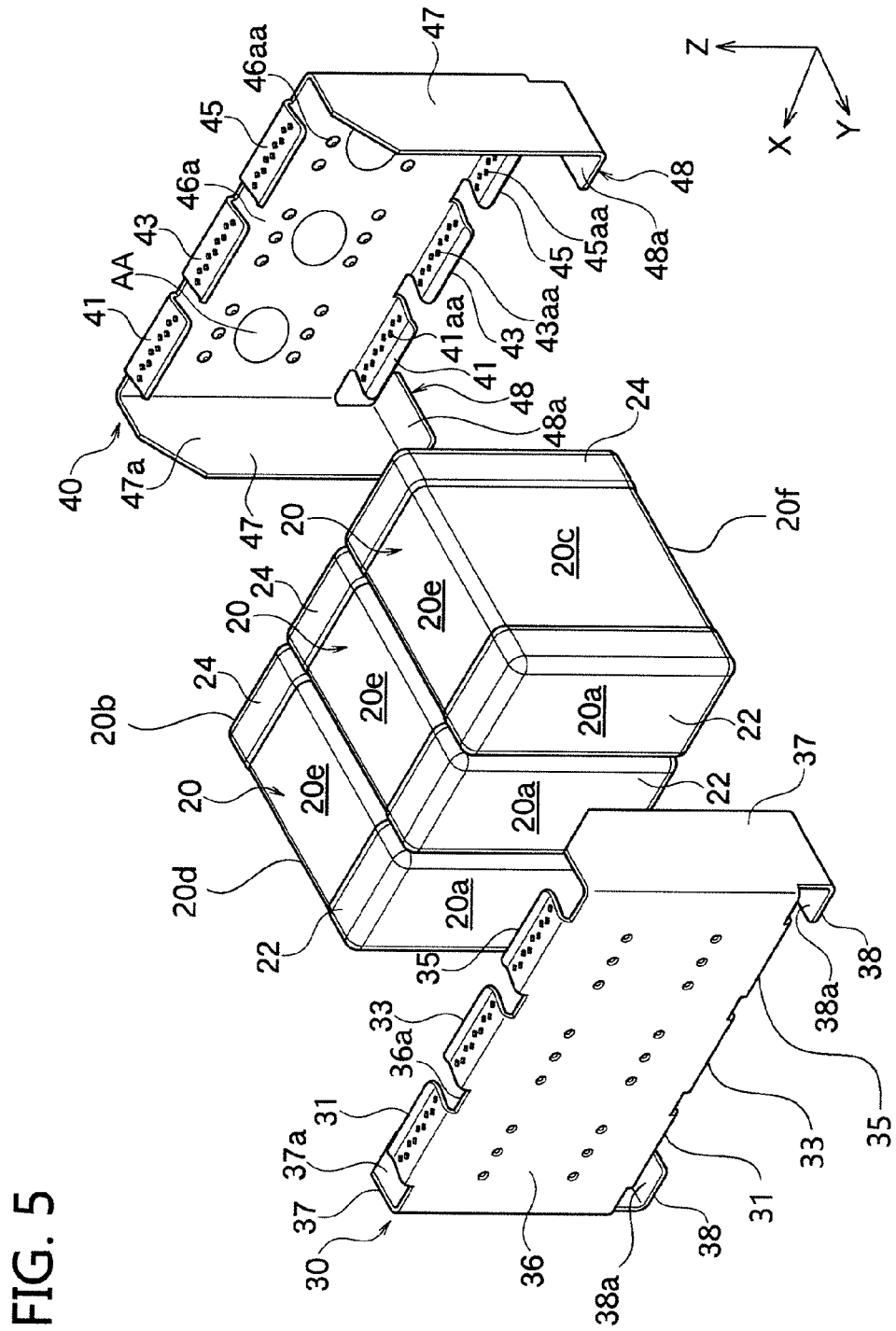
FIG. 5 is the exploded perspective view of the ceramic electronic component shown in FIG. 1.

Also, for the explanation of the ceramic capacitor 10, as shown in FIG. 5, the direction which connects the first side face 20c and the second side face 20d of the chip capacitor 20 is defined as X axis direction, and the direction which connects the first end 20a and the second end face 20d is defined as Y axis direction, and the direction which connects the third side face 20e and the fourth side face 20f is defined as Z axis direction.

Figure 6:
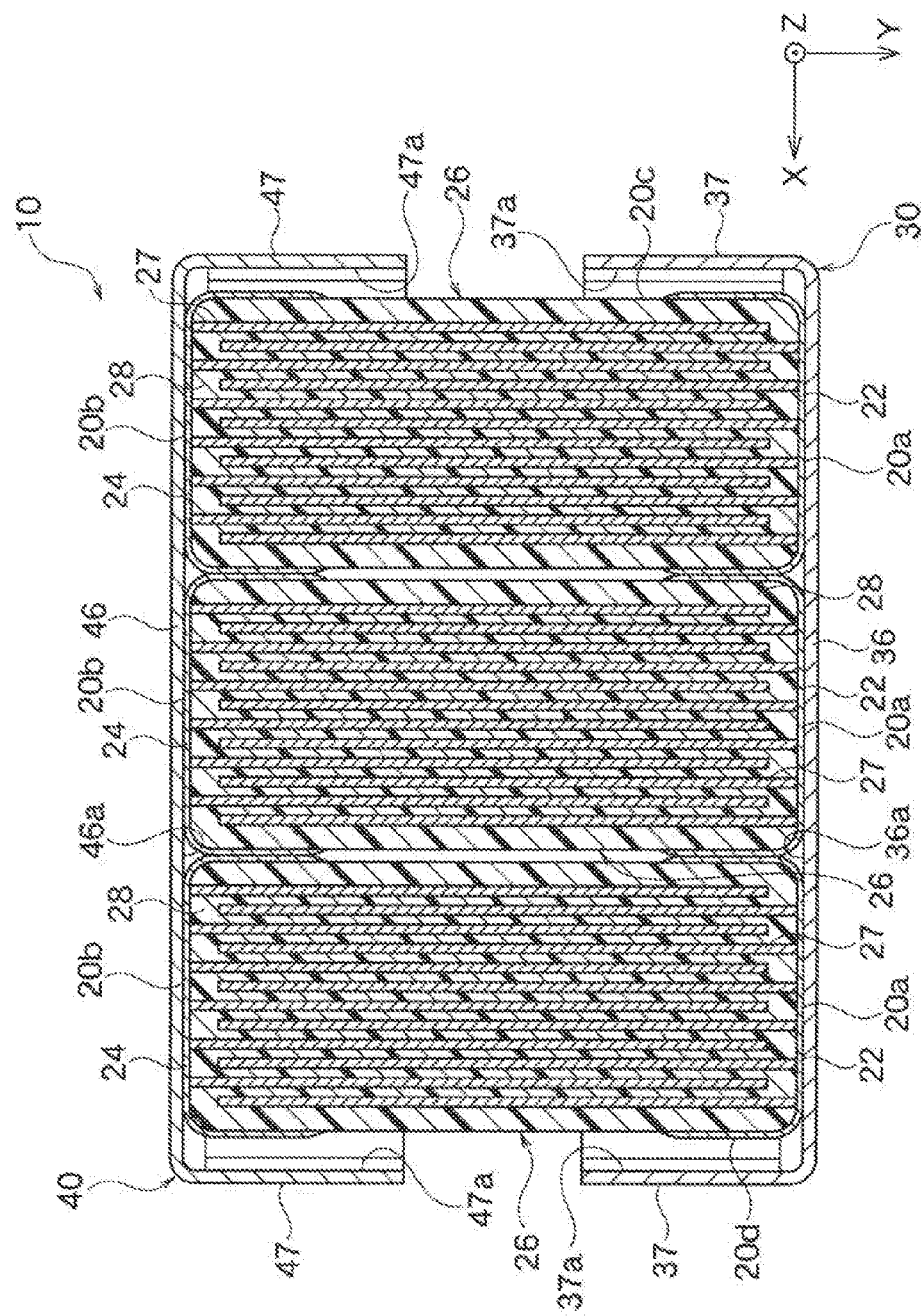
FIG. 6 is a schematic cross section of the ceramic electronic component shown in FIG. 1

FIG. 6 is a cross section of the ceramic capacitor 10 shown in FIG. 1, and particularly, the internal structure of the chip capacitor 20 is schematically shown. The chip capacitor 20 comprises the capacitor element 26 and first terminal electrode 22 and the second terminal electrode 24. The capacitor element 26 comprises the dielectric layer 28 as the ceramic layer, and the internal electrode layer 27; and the dielectric layer 28 and the internal electrode layer 27 are stacked in an alternating manner.

The internal electrode layer 27 has those which connects with the first terminal electrode 22 and those which connects with the second terminal electrode 24; and the internal electrode layer 27 connecting to the first terminal electrode 22 and the internal electrode layer 27 connecting to the second terminal electrode layer 24 are stacked in an alternating manner via the dielectric layer 28.

The material of the dielectric layer 28 is not particularly limited, and it may be constituted from the dielectric layer material such as calcium titanate, strontium titanate, barium titanate or the mixture thereof. The thickness of each dielectric layer 28 is not particularly limited, and generally it may be several μm to several hundred μm or so. In the present embodiment, preferably it is 1.0 to 5.0 μm. Also, the dielectric layer preferably has the barium titanate as the main component which can enlarge the capacitance of the capacitor.

The conductive material comprised in the internal electrode layer 27 is not particularly limited, however in case the constituting material of the dielectric layer 28 comprises a reduction resistance, and base metals which are relatively inexpensive can be used. As the base metal, Ni or Ni alloy are preferable. As Ni alloy, the alloy between Ni and at least one element selected from Mn, Cr, Co and Al are preferable; and preferably the content of Ni in the alloy is 95 wt % or more.

Note that, in Ni or Ni alloy, various trace components such as P or so may be included by 0.1 wt % or so or less. Also, the internal electrode layer 27 may be formed by using the commercially available electrode paste. The thickness of the internal electrode layer 27 may be determined in accordance with the use or so.

The material of the terminal electrodes 22 and 24 are not particularly limited, and usually copper and copper alloy, nickel and nickel alloy, or so may be used, and also silver, alloy of silver and palladium or so may be used as well. The thickness of the terminal electrodes 22, 24 are not particularly limited, and usually it is 10 to 50 μm or so. Note that, at the surface of the terminal electrodes 22, 24, a metal coating of at least one element selected from Ni, Cu, Sn or so may be formed.

The shape and the size of the chip capacitor 20 may be determined according to the use and the purpose. In case the chip capacitor 20 is the parallelepiped shape, usually of the length (0.6 to 5.6 mm, preferably 3.2 to 5.6 mm)×the width (0.3 to 5.0 mm, preferably 1.6 to 5.0 mm)×the thickness (0.1 to 1.9 mm, preferably 1.6 to 5.6 mm) or so.

Figure 2:
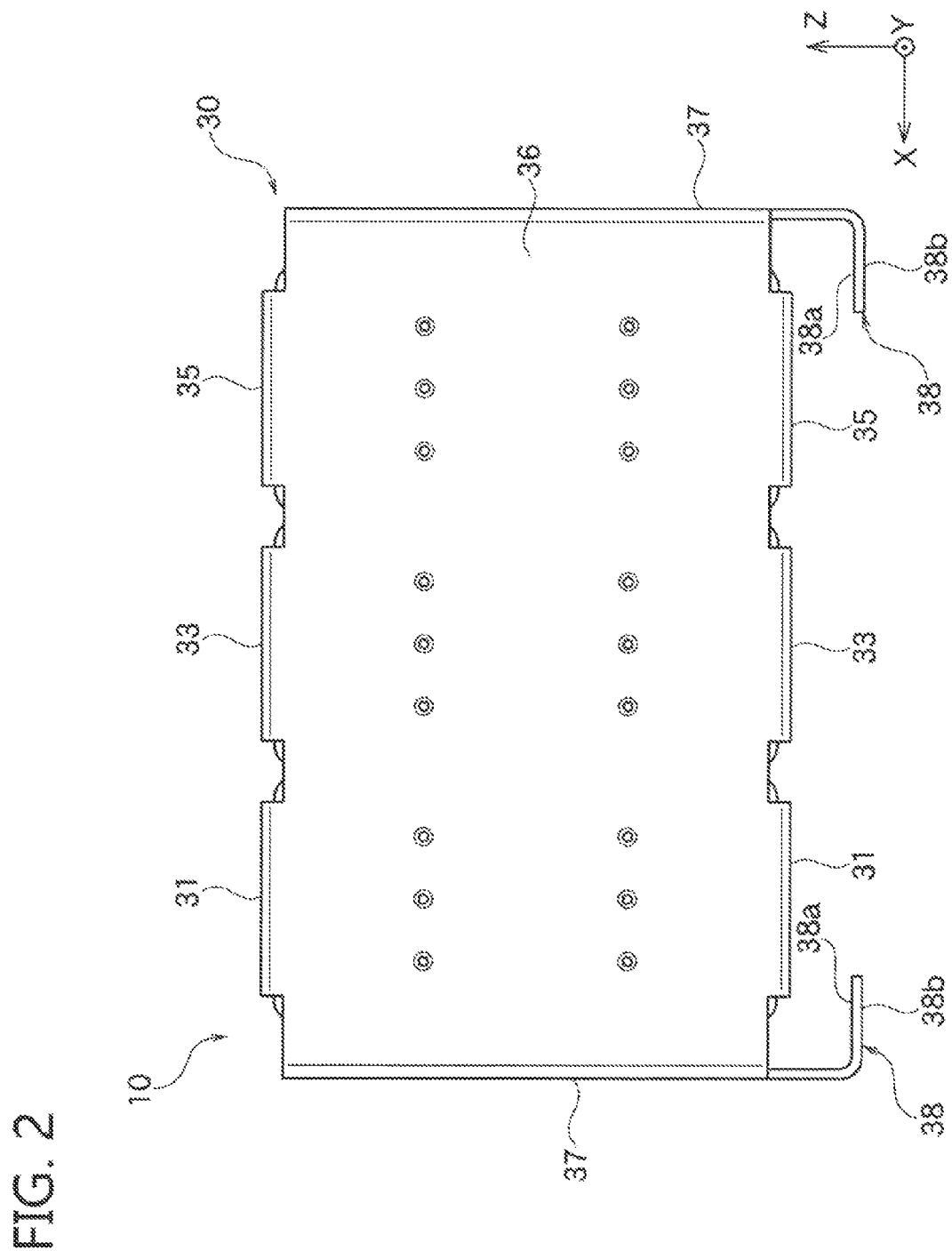
FIG. 2 is the front view of the ceramic electronic component shown in FIG. 1.
Figure 3:
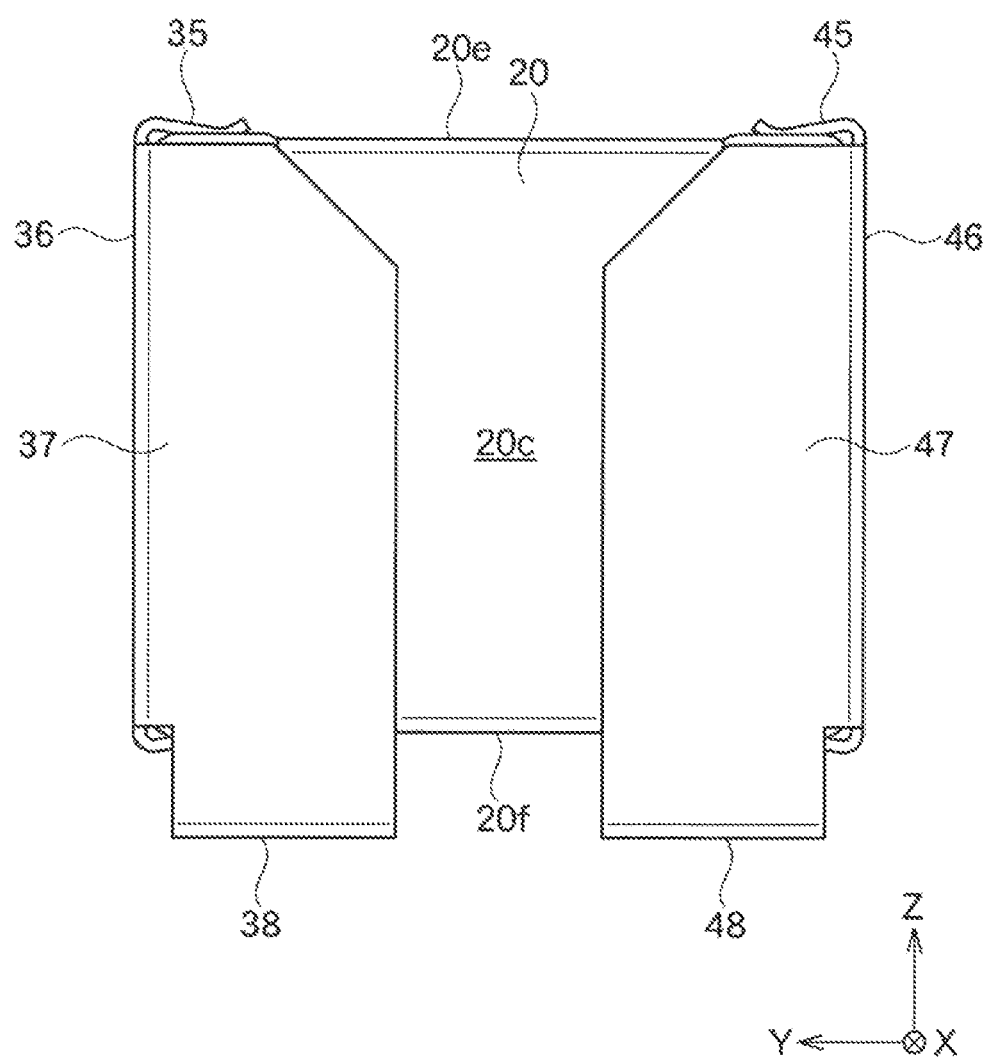
FIG. 3 is the right side view of the ceramic electronic component shown in FIG. 1.
Figure 4:
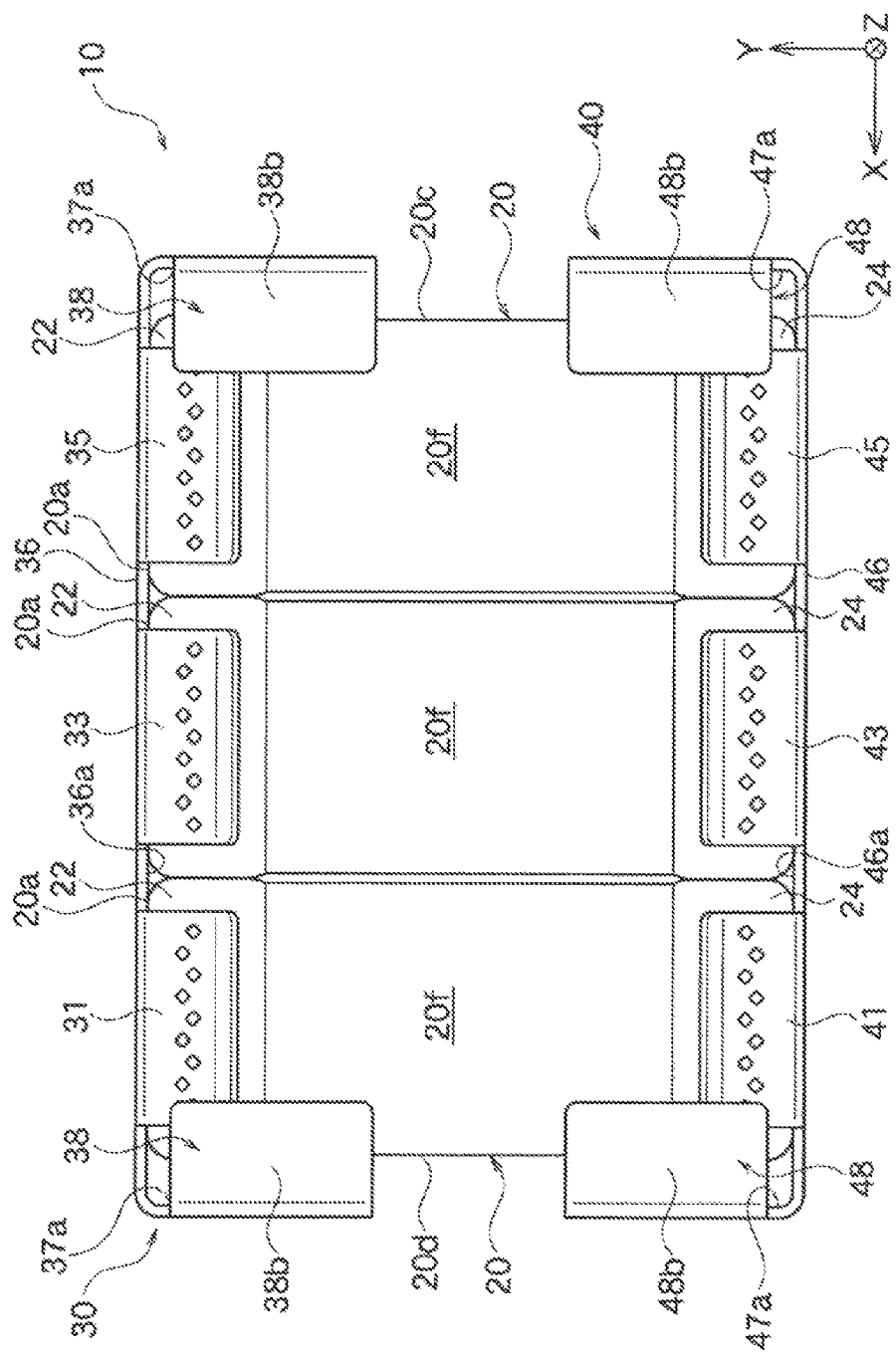
FIG. 4 is the bottom view of the ceramic electronic component shown in FIG. 1.

As shown in FIG. 2, the ceramic capacitor 10 comprises three chip capacitors 20. The three chip capacitors 20 have basically the same shape. However, the number of the chip capacitors 20 comprised in the ceramic capacitor 10 may be one, two or four or more, and in case plurality of chip capacitors 20 are comprised, the size and the shape may be different from each other.

The chip capacitors 20 is approximately a parallelepiped shaped constituted from six faces which are a first end face 20a, a second end face 20b, a first side face 20c, a second side face 20d, a third side face 20e and a fourth side face 20f. As shown by FIG. 5 and FIG. 6, the first end face 20a faces to the connecting part inner face 36a of the metal terminal part 30, and a second end face 20b is parallel to the first end face 20a, and faces the connecting part inner face 46a of the metal terminal part 40.

The chip capacitor 20 comprises the first end face 20a and the second end face 20b which faces against each other. Also, the first end face 20a and the second end face 20b is an approximate rectangular shape. The chip capacitor 20 comprises a first and second side faces 20c, 20b facing against each other and extends so that the longitudinal side of the first and the second end face 20a, 20b are connected, and the third and the fourth side faces 20e, 20f facing against each other and extends so that the short side of the first and the second end faces 20a, 20b are connected.

Then, as shown in FIG. 5, the longitudinal direction of the end faces 20a, 20b is arranged so that it is parallel to Z axis direction (the perpendicular direction to the amounting part 38), and the short direction of the end faces 20a, 20b is arranged so that it is parallel to the mounting part 38 (X axis direction). In the present embodiment, as shown in FIG. 6, the internal electrode layer 27 and the dielectric layer 28 of the inside of the chip capacitor 20 are stacked in an alternating manner in a direction facing the first side face 20c and the second side face 20d. Also, the internal electrode layer 27 and the dielectric layer 28 are arranged so that it is approximately perpendicular against the mounting part or the mounting face (of the circuit board). That is, each chip capacitor 20 is a chip component having a stacking direction approximately parallel against the mounting part upper face; and the internal electrode layer 27 and the dielectric layer 28 are stacked in X axis direction.

Among the four side faces 20c to 20f of the chip capacitor 20, as shown in FIG. 5, the first side face 20c and the second side face 20d are arranged approximately perpendicular against the mounting part 38 of the metal terminal part 30 and the mounting part 48 of the metal terminal part 40. Further, in comparison to this, the third side face 20 and the fourth side face 20f are arranged approximately parallel to the mounting part 38 of the metal terminal part 30 and the mounting part 48 of the metal terminal part 40. Also, the third side face 20e is an upper side face facing the opposite direction of the lower mounting part 38 and 48; and the fourth side face 20f is a lower side race facing the mounting part 38 and 48.

As shown in FIG. 1 and FIG. 5, the first terminal electrode 22 of the chip capacitor 20 is formed so that it wraps around a part of the side faces 20c to 20f from the first end face 20a. Therefore, the first terminal electrode 22 comprises the part arranged at the first end face 20a, and the part arranged at the first side face 20c to the fourth side face 20f (refer to FIG. 1 to FIG. 5).

Also, the second terminal electrode 24 of the chip capacitor 20 is formed so that it wraps around other part of the side faces 20c to 20f from the second end face 20b (different part from that the first end terminal electrode 22 wraps around). Therefore, the second terminal electrode 24 comprises the part arranged at the second end face 20b, and the parts arranged at the first side face 20c to the fourth side faces 20f (refer to FIG. 1 to FIG. 5). Also, in the first side face 20c to the fourth side face 20f, the first terminal electrode 22 and the second terminal electrode 24 are formed by being insulated by taking predetermined space apart in the Y axis direction.

As shown in FIG. 1, the metal terminal parts 30, 40 is placed at the both end parts along the Y axis direction of the chip capacitor 20 in accordance with the first and the second terminal electrodes 22, 24 of the chip capacitor 20. The three chip capacitors 20 are held by the metal terminal parts 30, 40 while being arranged in the X axis direction along the face approximately parallel to the mounting part upper faces 38a, 48a.

As shown in FIG. 6, the metal terminal part 30 comprises the connecting part 36 connected with the first terminal electrode 22 and having the connecting part inner face 36a which extends approximately parallel to the first end face 20a of the plurality of the chip capacitors 20. This metal terminal part 30 comprises plurality of joint parts 37 connected as one body with the connecting part 36 and having the joint part inner face 37a extending in a different direction from the connecting part inner face 36a and approximately parallel to the first and the second side faces 20c, 20d by taking a predetermined space apart. Also, as shown in FIG. 5, the metal terminal part 30 comprises plurality of mounting parts 38 connected as one body with the joint part 37 and having the mounting part upper face 38a extending in a different direction from the joint part inner face 37a and approximately parallel against the fourth side face 20f by taking predetermined space apart therefrom.

Also, as shown in FIG. 6, the metal terminal part 40 comprises connecting part 46 connected to the second terminal electrode 24 and having the connecting part inner face 46a extending approximately parallel to the second end face 20b of the plurality of the chip capacitors 20. This metal terminal part 40 comprises plurality of joint parts connected to the connecting part 46 as one body and having the joint inner face 47a extending in a different direction from the connecting part inner face 46a and approximately parallel against the first and the second side faces 20c, 20d by taking a predetermined space apart. Also, as shown in FIG. 5, the metal terminal part 40 comprises plurality of mounting parts 48 connected as one body with the joint part 47 and having the mounting part upper face 48a extending in a different direction from the joint part inner face 47a and approximately parallel to the fourth side face 20f by taking predetermined space apart. Note that, the metal terminal part 40 is arranged symmetrical against the metal terminal part 30 by having the chip capacitor 20 in between, however since the shape itself is the same as the metal terminal pat 30, the detailed explanation of the structure of the metal terminal part 40 will be omitted.

The connecting part inner face 36a of the connecting part 30 faces the first end face 20a of the chip capacitor 20; and at the connecting part inner face 36a, the projection part which contacts with the first end face 20a by projecting out to the first end face 20a is formed. The shape of the projection part is the same as the projection part 46aa at the metal terminal part 40 of FIG. 5. The projection part reduces the contact area between the connection part inner face 36a and the first end face 20a, thereby it exhibits the effect which makes difficult to transfer the vibration of the chip capacitor 20 to the metal terminal part 30.

As shown in FIG. 5, the connecting part 36 of the metal terminal part 30 is connected as one body with the connecting part inner face 36a, and comprises a pair of first fitting arm parts 31 holding the third side face 20e and the fourth side face 20f of the chip capacitor 20, which is arranged at a forward direction side of X axis, from the both sides in the Z axis direction. Also, this connecting part 36 is connected as one body with the connecting part inner face 36a by taking a predetermined space in X axis direction against the first fitting arm part 31, and comprises a pair of second fitting arm parts 33 holding the third joint part inner face 37 aside face 20e and the fourth side face 20f of the chip capacitor 20, which is arranged at X axis direction, from the both sides in the Z axis direction. Further, this connecting part 36 is connected as one body with the connecting part inner face 36a by taking a predetermined space in X axis direction against the second fitting arm part 33, and comprises a pair of third fitting arm parts 35 holding the third side face 20e and the fourth side face 20f of the chip capacitor 20, which is arranged at a negative direction side of X axis, from the both sides in the Z axis direction.

Each fitting arm parts 31, 33, 35 faces to the third side face 20e which is the upper side face and the fourth side face 20f which is the lower side of the chip capacitor 20; and particularly among the third side face 20e and the fourth side face 20f, the first terminal electrode 22 contacts the area where the side face 20e and 20f are wrapping around. Also, the arm inner face which is the face of the chip capacitor 20 side of the fitting arm parts 31, 33, 35, plurality of inner projection parts projecting towards the chip capacitor 20 is formed. Among plurality of the inner projection parts, at least part of it engages with the first terminal electrode 22, and allows the electrical connection. Note that, the shape of the inner projection part the same as the inner projection parts 41aa, 43aa, 45aa of the metal terminal parts 40 of FIG. 5.

The inner projection parts prevents the metal terminal part 30 from coming off from the first terminal electrode 22, and also ensures to secure the conduction between the first terminal electrode 22 and the fitting arm parts 31, 33, 35. Note that, at the arm outer face which is the face of the opposite side from the arm inner face, the depression which is the turned over shape of the projection of the arm inner face is formed, and such projections and depressions improves the heat dissipation characteristic of the metal terminal part 30, and suppress the temperature increase of the chip capacitor 20.

As such, the metal terminal part 30 and the chip capacitor 20 are bonded by the holding force of the fitting arm parts 31, 33, 35; but in addition, the first end face 20a of the chip capacitor 20 and the connecting part inner face 36a of the metal terminal part 30 may be bonded by the adhesive agent. In such case, at the bonding portion of the connecting part inner face 36a, for example, the surface treatment such as removing the above mentioned metal coating may be carried out, to preferably form the area having higher bonding property with the adhesive agent compared to other portion (for example, the mounting part lower face 38b shown in FIG. 2) formed with the metal coating.

Also, as the adhesive agent, it is not particularly limited; however in order to enhance the adhesive strength between the chip capacitor 20 and the metal terminal part 30, it is preferably a nonconductive adhesive agent. Generally, the conductive component such as conductive filler or the conductive metal particles or so added to give conductivity to the adhesive agent does not contribute to improve the adhesiveness. Therefore, by using the nonconductive adhesive agent constituted by the resin or so which does not include the conductive component such as the conductive filler or the conductive metal particles or so, a higher adhesiveness can be obtained compared to the conductive adhesive agent including the conductive component. As for the nonconductive adhesive agent, for example, a heat curable resin or so such as epoxy resin, phenol resin or so can be used.

As shown in FIG. 5, the metal terminal part 30 comprises two joint parts 37, wherein one joint part 37 is connected to the end part of the X axis positive direction of the connecting part 36, and other joint part 37 is connected to the end part of the negative direction of X axis of the connecting part 36. Therefore, two joint parts 37 are arranged so that three chip capacitors 20 are held therebetween from the both sides of X direction of the arranging direction of the chip capacitor 20. The joint part inner face 37a of the joint part 37 is arranged by taking a predetermined space against the first side face 20c or the second side face 20d adjacent to the fourth side face 20f which is parallel to the mounting part upper face 38a.

Also, the end part in Z axis positive direction of the joint portion inner face 37a is at the same height as the end part of Z axis positive direction of the connecting part inner face 36a; and the end part in Z axis of negative direction of the joint part inner face 37a is lower than the end part in Z axis negative direction of the connecting part inner face 36a; therefore, the joint part inner face 37a is enlarged to Z axis direction from the connecting part inner face 36a. Thereby, the effect of preventing the deformation of the connecting part inner face 36a by the joint part inner face 37a reaches to entire connecting part inner face 36a. Note that, if the strength of the connecting part inner face 36a is ensured, the end part of Z axis positive direction of the joint part inner face 37a may be lower than the end part in Z axis direction of the connecting part inner face 36a.

The metal terminal part 30 comprises two mounting parts 38, and one mounting part 38 connects to the joint part 37 connecting to the end part of X axis positive direction of the connecting part 36; and one other mounting part 38 is connected to the joint part 37 connecting to the end part of X axis negative direction of the connecting part 38. Two mounting parts 38 are placed at the same distance from the fourth side face 20f of the lower side face of the chip capacitor 20, and two mounting part lower faces 38b are positioned on the same planar.

The mounting part 38 is a part bonded to the base board by solder or so when mounting the ceramic capacitor 10 to the base board or so; and the ceramic capacitor 10 is placed on the mounting base board so that the ceramic capacitor 10 faces the base board of which the mounting part lower face 38b faces towards Z axis negative direction is the subject to be mounted. Two mounting parts 38 extend to the side facing the chip capacitor 20 from the connecting portion with the joint part 37 that is to the direction facing each other from the both end part in X axis direction; and the tip of the mounting part 38 is positioned at the lower side of the chip capacitor 20.

Note that, the mounting part upper face 38a which is the surface at the side of the chip capacitor 20 in the mounting part 38 preferably has lower wettability against the solder than the mounting part lower face 38b, from the point of preventing the solder from excessively wrapping around which is used when mounting the chip capacitor 20 to the base board.

As shown in FIG. 5, at the metal terminal part 30, the connecting part 36 is connected to the first end face 20a, and at the both end parts along X axis direction of the connecting part 36, it is connected to one joint part 37 and other joint part 37 respectively. One joint part 37 (X axis negative direction side) is bent approximately in 90 degrees from the connecting part inner face 36a of the connecting part 36; and placed so that it is parallel and spaced apart with the first side face 20c. One other joint part 37 (X axis positive direction side) is bent approximately in 90 degrees from the connecting part inner face 36a of the connecting part 36; and placed so that it is parallel and spaced apart with the first side face 20d.

Further one mounting part 38 (X axis negative direction side) is bent approximately 90 degrees from one joint part 37 (to the different direction from the direction of which the connecting part inner face 36a and the joint part 37 are bent over); and placed so that it is parallel and spaced apart with the fourth side face 20f. Other mounting part 38 (X axis positive direction side) is bent approximately 90 degrees from other joint part 37 (to the different direction from the direction of which the connecting part inner face 36a and the joint part 37 are bent over); and placed so that it is parallel and spaced apart with the fourth side face 20f. Further, one mounting part 38 and other mounting part 38 extends from the end part of each joint part 37 and to the direction facing each other.

In the present embodiment, the connecting part inner face 36a and the joint part inner face 37a, the joint part inner face 37a and the mounting part upper face 38a, and the mounting part upper face 38a and the connecting part inner face 36a are facing to the different direction in 90 degrees against each other. That is, the connecting part inner face, one joint part inner face and one mounting part upper face are facing different direction in 90 degrees against each other.

Also, the connecting inner face, other joint part inner face, and other mounting part upper face are facing to the different direction in 90 degrees against each other. Therefore, the electrostriction vibration direction in the chip capacitor 20 is dispersed, and can relieve. Also, it can divide into the electric current passage flowing from the connecting par 36 to one mounting part 38 via one joint part 37, and the electric current passage flowing from the connecting part 36 to other mounting part 38 via other joint part 37, and also as the transmission route can be shortened, low ESL and low ESR can be realized.

Note that, in the present embodiment, the ceramic capacitor 10 comprising three chip capacitors 20 is used as an example; and one joint part 37 is formed at the first side face 20c side of one chip capacitor 20 (the X axis negative direction side) formed at the outer side, and other joint part 37 is formed at the second side face 20d side of other chip capacitor 20 (X axis positive direction side) is formed at the outer side, however the chip capacitor 20 may be one.

Also, in the present embodiment, plurality of chip capacitors 20 are placed parallel against the mounting face thus compared to the case wherein plurality of the chip capacitors 20 are placed perpendicular against the mounting face, the transmission route can be made shorter and low ESL can be achieved. Also, since the internal electrode layer 27 is placed perpendicular against the mounting face, compared to the case wherein it is placed parallel against the mounting face, the transmission route can be suppressed from becoming longer along with the increase of the stacking number, and low ESL can be achieved. Further, in the present embodiment, in case the length of Z axis direction is Lz, the length of Y axis is Ly, and length of X axis direction is Lx in each chip capacitor 20, those satisfies the relation of Lz>Ly>Lx, and low ESL can be achieved from this point of view; and also space can be saved (higher density) done as well.

In regards with the connection part 46, the joint part 47, the mounting part 48, the mounting part upper face 48a provided to the mounting part 48, the first fitting arm 41 provided to the mounting part 48b and the mounting part lower face 48b, the first fitting arm part 41, the second fitting arm part 43 and the third fitting arm part 43 provided to the connection part 46 of the metal terminal part 40, these have the same constitution as the metal terminal part 30. The material of the metal terminal parts 30, 40 is not particularly limited, as long as it is a metal material with the conductivity, and for example iron, nickel, copper, silver or so, and the alloys thereof can be used. Particularly, the material of the metal terminal parts 30, 40 is phosphor bronze, from the point of suppressing the resistivity of the metal terminal parts 30, 40, and of lowering the ESR of the capacitor 10.

Herein below, the method production of the ceramic capacitor 10 will be described.

The Production Method of the Multilayered Ceramic Chip Capacitor 20

For the production of the multilayered ceramic chip capacitor 20, first, the multilayered body is made by stacking the green sheet (which becomes a dielectric layer 28 after firing) formed with the electrode pattern which becomes the internal electrode layer 27 after firing, then the obtained multilayered body is pressured and fired, thereby the capacitor element 26 is obtained. Further, by forming the first terminal electrode 22 and the second terminal electrode 24 to the capacitor element 26 by firing or plating the paste for the terminal electrode, the chip capacitor 20 is obtained. The green sheet paste or the internal electrode layer paste which is the source material of the multilayered body, the source material of the terminal electrode, and the firing condition or so of the multilayered body and the electrode are not particularly limited, and it may be determined by referring to the known production methods or so.

In the present embodiment, the ceramic green sheet using barium titanate as the main component was used as the dielectric material. Also, for the terminal electrode, the firing layer is formed by immersing Cu paste, and carrying out the firing treatment, then Ni plating, Sn plating are carried out thereby Cu firing layer/Ni plating layer/Sn plating layer is formed.

The Production Method of the Metal Terminal Portion 30, 40

For the production of the metal terminal 30, first the metal plate of planar shape is prepared. The material of the metal plate is not particularly limited as long as it is a metal material with the conductivity, and for example iron, nickel, copper, silver or so, and the alloy thereof can be used. Next, by carrying out the mechanical processing of the metal plate, the shape of the fitting arm parts 31, 33, 35, the connection part 36, the joint part 37 and the mounting part 38 are formed.

For example, the face corresponding to the connecting part inner face 36a and the joint part inner face 37a by bending the plate of planar shape in 90 degrees, the face corresponding to the mounting part upper face 38a can be formed. Also, to the portion corresponding to the fitting arm parts 31, 33, 35, the shape of the depression and the projection which corresponds to the inner side projection part can be formed by the press processing or the roughening treatment such as sand blast or chemical etching or so.

Next, to the surface of the intermediate member formed by the mechanical processing, by forming a metal coating by the plating or so, the metal terminal part 30 is obtained. As for the material used for the plating, it is not particularly limited; however Ni, Sn, Cu or so may be mentioned. Also, when carrying out the plating treatment, by carrying out the resist treatment to the adhesive agent adhering portion of the mounting part upper face 38a of the mounting part 38 and the connecting part inner face 36a, the plating is prevented from adhering to a part of the mounting part upper face 38a and the connecting part inner face 36a.

Thereby, a difference of the wettability against the solder can be formed between the mounting part upper face 38a and the mounting part lower face 38b; and also the bonding property against the adhesive agent of the connecting part inner face 36a can be made higher than other parts carried out with the metal coating. Note that, after forming the metal coating by carrying out the plating treatment to entire intermediate members, the same difference can be formed by removing only the metal coating formed on the mounting part upper face 38a and the connecting part lower face 38b by the laser releasing or so.

The production method of the metal terminal part 40 is the same as the metal terminal part 30.

The Assembly of the Ceramic Capacitor 10

Three chip capacitors 20 obtained as discussed in above are prepared, and while being held by aligning as shown in FIG. 5, the metal terminal parts 30, 40 are installed respectively to the first terminal electrode 22 and the second terminal electrode 24, thereby the ceramic capacitor 10 is obtained. Before carrying out the installation to the chip capacitor 20, to the part where the metal coating is not formed in connection part inner faces 36a, 46a of each metal terminal part 30, 40, the adhesive agent AA is applied in advance. The adhesive agent does not have to be applied to entire surface of the connecting part inner face 36a, 46a of each metal terminal part 30, 40, and it may be applied to part of it.

The tip of each fitting arm part of the metal terminal part 30, 40 is curved so that it is spaced apart against each other, thus just by bringing each end face 20a, 20b of chip capacitor 20 and the connecting part inner face 36a, 46a of the metal terminal part 30, 40 closer, the terminal electrode 22, 24 can be placed between a pair of the fitting arm parts 31, 33, 35, 41, 43, 45.

Note that, the joint part 37, 47 of the metal terminal part 30, 40 can prevent the connecting part inner face 36a, 46a from deforming when placing the chip capacitors 20 in between, thus the metal terminal part 30, 40 to which the joint part 37 are connected to both ends of the connecting part can be securely held by the chip capacitor 20.

In case the adhesive agent is a heat curable adhesive agent, after the first and the second metal terminal part 30, 40 are installed to the chip capacitor 20; the adhesive agent is cured by carrying out the heat treatment at the predetermined temperature. Note that, if needed, the terminal electrodes 22, 24 and the inner side projection parts of the fitting arm part 31, 33, 35, 41, 43, 45 engaging therewith may be welded by melting the metal plate formed on the surface of both or either one. Thereby, the electrical bonding between the terminal electrode 22, 24 and the metal terminal parts 30, 40 can be improved, and the physical bonding between the chip capacitor 20 and the metal terminal parts 30, 40 can be reinforced.

As such, the metal terminal parts 30, 40 comprises the joint part 37 between the connecting part 36 and the mounting part 38, and the mounting part 38 and the chip capacitor 20 has predetermined spaced in between, thus it is compact and also allows to secure the longer transmission route of the vibration from the chip capacitor 20 to the mounting part 38 compared to the conventional ones. Also, by spreading the vibration direction when propagating the vibration via the joint part 37, thereby the vibration is suppressed from transferring to the mounting base board from the chip capacitor 20 via the metal terminal 30, 40. Note that, the predetermined space between the mounting part 38 and the chip capacitor 20 is not particularly limited as long as it exhibits the above mentioned effect, however preferably it is 0.1 mm or more and 1.5 mm or less, and further preferably 0.5 mm or more and 1.0 mm or less. If it is within such range, the entire height can be suppressed, while lowering ESL and ESR, and further the above mentioned effect can be maintained as well.

Therefore, such ceramic capacitor 10 can reduce the squealing noise when using it. Also, as the metal terminal parts 30, 40 comprises plurality of the joint parts 37, 47, and the mounting part 38, 48, thereby the transmission route in the metal terminal parts 30, 40 are shortened, hence ESL can be lowered.

Also, in the ceramic capacitor 10, the metal terminal parts 30, 40 comprises the fitting arm parts 31, 33, 35, 41,43, 45, thereby it is held by holding the side faces 20e, 20f of the chip capacitor 20 in between. Therefore, the ceramic capacitor 10 can be easily assembled. Also, for the ceramic capacitor 10, even if it is used under high temperature environment or under the environment having large temperature difference, there is no risk that the bond between the chip capacitor 20 and the metal terminal parts 30, 40 disengaging due to the difference of the heat expansion coefficient between the bonding material and the metal terminal parts 30, 40 unlike the conventional art using the solder as the bonding material.

Also, each fitting arm part 31, 33, 35, 41, 43, 45 are connected to the connecting part inner faces 36a, 46a by taking a predetermined space; and since each fitting arm parts independently hold each chip components, even if there is a size variations between the three chip capacitors 20 being held, each chip capacitor 20 can be securely held.

Further, for the ceramic capacitor 10, since there is a predetermined space formed between the joint part inner faces 37a, 47a and the first side face 20c or the second side face 20d, even if there is a size variation of the chip capacitor 20, the metal terminal parts 30, 40 can be stably installed to the chip capacitor 20.

Also, the ceramic capacitor 10 formed with such space suppresses the transmission of the vibration from the chip capacitor 20; hence the squealing noise can be suppressed. By having wider space between the joint part inner face 37a, 47a and the first side face 20c or the second side face 20d, the area where the mounting part upper face 38a, 48a facing the fourth side face 20f can be made small. Also, the position of the mounting part upper faces 38a, 48a and the fourth side face 20f can be shifted in X axis direction thereby it can be made so that those does not face against each other.

Thereby, the solder can be prevented from adhering across the mounting part upper faces 38a, 48a and the chip capacitor 20, or the mounting part upper faces 38a, 48a and the fitting arm parts 31, 335, 41,45 positioned at the lower chip capacitor 20; thus the squealing noise can be prevented from this point of view as well. Note that, the space between the joint part inner faces 37a, 47a and the first side face 20c or the second side face 20d is not particular limited as long as it exhibits the above mentioned effect, however preferably it is larger than 0 mm and 1.5 mm or less, and further preferably 0.2 mm or more and 1.3 mm or less. If it is within such range, the above mentioned effect can be maintained without enlarging the mounting surface.

Also, for the ceramic capacitor 10, the conduction between the chip capacitor 20 and the metal terminal parts 30, 40 via the fitting arm parts 31, 33, 35, 41, 43, 45 can be secured. Thus, there is no need to use the high temperature solder for the bonding of the metal terminal parts 30, 40 and the chip capacitor 20 unlike the conventional arts in which the metal terminal part and the chip component were bonded by the solder or the adhesive agent, hence the use of environment load material can be suppressed.

Also, by forming plurality of inner side projection parts 41aa, 43aa, 45aa at the arm inner face, even if the shape of the terminal electrodes 22, 24 of the chip capacitor 20 has production variation, the fitting arm parts 31, 33, 35, 41, 43, 45 can exhibit a suitable force to hold the chip capacitor 20; and also at least one of the inner projection parts 41aa, 43aa, 45aa and the terminal electrodes 22, 24 can be securely engaged, hence the electric conduction can be ensured.

Also, the tip of the mounting parts 38, 48 extends at the middle of the ceramic capacitor 10, hence the area necessary for the mounting is reduced compared to the shape of which the tip of the mounting parts 38, 48 extends at the outer side of the ceramic capacitor 10, thereby the high density mounting is realized. For example, by aligning many ceramic capacitors 10 in a matrix form on the mounting base board, and electrically connecting the mounting parts 38, 48 of each ceramic capacitor 20, thereby it is possible to form a capacitor having high capacity or the high voltage resistance in a limited space of the mounting base board.

Also, for the ceramic capacitor 10, by making the stacking direction approximately parallel to the mounting part upper faces 38a, 48a, it prevents the height of the ceramic capacitor 10 from becoming high in case the stacked number increases, thereby the low height is realized and suppresses the problem of the transmission route from becoming too long, and achieves low ESL.

Also, the ceramic capacitor 10, wherein the end faces 20a, 20b of the chip capacitor 20 and the connecting parts 36, 46 of the meta terminal parts 30, 40 are bonded by the adhesive agent has suitable electrical and structural reliability with respect to the deformation and the impact from the outside.

Other Embodiments

The ceramic capacitor 10 as discussed in the above embodiment is merely one embodiment of the present invention, and various modifications are obviously possible. For example, the connecting part of the metal terminal part can be connected to the terminal electrodes 22, 24 via the conductive adhesive agents or so instead of the fitting arm part. Also, the chip capacitor 20 held by the ceramic capacitor 10 may be aligned in a height direction (Z axis direction) instead of planar direction (X axis direction and Y axis direction), and also it may be aligned in a planar direction and the height direction, a two dimension or three dimension.

Also, the joint parts 37, 47 and the mounting parts 38, 48 comprised in the metal terminal parts 30, 40 are not particularly limited as long as it is plurality, and each meta terminal parts 30, 40 may comprise three or more joint parts 37, 47 or the mounting parts 38, 48.

NUMERICAL REFERENCE

10 . . . Ceramic capacitor
20 . . . Chip capacitor
20a . . . First end face
20b . . . Second end face
20c . . . First side face
20d . . . Second side face
20e . . . Third side face
20f . . . Fourth side face
22 . . . First terminal electrode
24 . . . Second terminal electrode
30,40 . . . Metal terminal part
31,33,35,41,43,45 . . . Fitting arm part
36,46 . . . Connecting part
36a,46a . . . Connecting part inner face
37, 47 . . . Joint part
37a,47a . . . Joint part inner face
38,48 . . . Mounting part
38a,48a . . . Mounting part upper face
38b . . . Mounting part lower face

The invention claimed is:

1. A ceramic electronic component with metal terminals comprising at least one chip component of approximately parallelepiped shape having a pair of terminal electrodes, and a pair of metal terminal parts provided in accordance with said pair of terminal electrodes, wherein
said pair of terminal electrodes is formed by wrapping around a part of one or more side faces from an end face of said at least one chip component,
said pair of metal terminal parts comprises a connecting part connecting to said pair of terminal electrodes and including a connecting face extending approximately parallel to said end face, a plurality of joint parts connecting to said connecting part and including a joint face extending in a different direction of said connecting face, and a plurality of mounting parts connecting to said joint parts and including a mounting part upper face extending approximately parallel to any one of said one or more side faces which is in a different direction of said joint face by taking predetermined spaces, and said joint face is placed by taking predetermined space with respect to another side face adjacent to one of said one or more side faces parallel with said mounting part upper face, wherein a gap is located between said joint face and said another side face adjacent to one of said one or more side faces parallel with said mounting part upper face, and wherein said joint face is not connected to said another side face adjacent to one of said one or more side faces parallel with said mounting part upper face.

2. The ceramic electronic component with metal terminal as set forth in claim 1, wherein said mounting part upper face is spaced apart with respect to one of said one or more side faces facing said mounting part upper face.

3. The ceramic electronic component with metal terminal as set forth in claim 1, wherein said connecting part comprises at least one pair of fitting arm parts connected to said connecting face and holding said one or more side faces of said at least one chip component by placing in between the fitting arm parts.

4. The ceramic electronic component with metal terminal as set forth in claim 3, wherein a pair of said fitting arm parts holds one of said one or more side faces approximately parallel to said mounting part upper face.

5. The ceramic electronic component with metal terminal as set forth in claim 1, wherein said connecting part comprises a pair of first fitting arm parts connected to said connecting face and holding said one or more side faces of one of said at least one chip component, and a pair of second fitting arm parts connected to said connecting face by taking a predetermined space with respect to said first fitting arm part and holding one of said one or more side faces of one of said at least one chip component.

6. The ceramic electronic component with metal terminal as set forth in claim 1, wherein said plurality of joint parts include one joint part having the joint face facing with one side face perpendicular against said mounting part upper face among said one or more side faces, and one other joint part including the joint face facing a different side face perpendicular against said mounting part upper face among said one or more side faces.

7. The ceramic electronic component with metal terminal as set forth in claim 6, wherein a plurality of said mounting parts include one mounting part connecting to the joint part including the joint face facing with said one side face, and one other mounting part connecting to the joint part including the joint face facing with said different side face; and said one mounting part and said one other mounting part extends to a direction facing each other.

8. The ceramic electronic component with metal terminal as set forth in claim 1, wherein a plurality of said mounting parts extends from a connecting portion with said joint part towards a portion facing against said at least one chip component.

9. The ceramic electronic component with metal terminal as set forth in claim 1, wherein said at least one chip component is a multilayered chip component with a stacking direction approximately parallel to said mounting part upper face.

10. The ceramic electronic component with metal terminal as set forth in claim 1, wherein said end face of said at least one chip component is bonded by nonconductive adhesive agent with said connecting face of said pair of metal terminal parts.

11. The ceramic electronic component with metal terminal as set forth in claim 1, wherein said at least one chip component is a multilayered ceramic capacitor comprising a dielectric layer and an internal electrode layer.

12. The ceramic electronic component with metal terminal as set forth in claim 1, comprising a plurality of said chip components aligned along a plane approximately parallel to said mounting part upper face.

13. A ceramic electronic component with metal terminals comprising at least one chip component of approximately parallelepiped shape having a pair of terminal electrodes, and a pair of metal terminal parts provided in accordance with said pair of terminal electrodes, wherein said pair of terminal electrodes is formed by wrapping around a part of one or more side faces from an end face of said at least one chip component, said pair of metal terminal parts comprises a connecting part connecting to said pair of terminal electrodes and including a connecting face extending approximately parallel to said end face, a plurality of joint parts connecting to said connecting part and including a joint face extending in a different direction of said connecting face, and a plurality of mounting parts connecting to said joint parts and including a mounting part upper face extending approximately parallel to any one of said one or more side faces which is in a different direction of said joint face by taking predetermined spaces, said connecting part comprises at least one pair of fitting arm parts connected to said connecting face and holding said one or more side faces of said at least one chip component by placing in between the fitting arm parts, said joint face is placed by taking predetermined space with respect to another side face adjacent to one of said one or more side faces parallel with said mounting part upper face, and said one or more side faces held by the fitting arm parts are different from said one or more side faces taken by predetermined space from said joint face, wherein a gap is located between said joint face and said another side face adjacent to one of said one or more side faces parallel with said mounting part upper face, and wherein said joint face is not connected to said another side face adjacent to one of said one or more side faces parallel with said mounting part upper face.

14. The ceramic electronic component with metal terminal as set forth in claim 13, wherein said mounting part upper face is spaced apart with respect to one of said one or more side faces facing said mounting part upper face.

15. The ceramic electronic component with metal terminal as set forth in claim 13, wherein a pair of said fitting arm parts holds one of said one or more side faces approximately parallel to said mounting part upper face.

16. The ceramic electronic component with metal terminal as set forth in claim 13, comprising a plurality of said chip components aligned along a plane approximately parallel to said mounting part upper face.

17. The ceramic electronic component with metal terminal as set forth in claim 16, wherein said connecting part comprises a pair of first fitting arm parts connected to said connecting face and holding said one or more side faces of one of said at least one chip component, and a pair of second fitting arm parts connected to said connecting face by taking a predetermined space with respect to said first fitting arm part and holding one of said one or more side faces of one of other said at least one chip component.

18. The ceramic electronic component with metal terminal as set forth in claim 13, wherein said plurality of joint parts include one joint part having the joint face facing with one side face perpendicular against said mounting part upper face among said one or more side faces, and one other joint part including the joint face facing a different side face perpendicular against said mounting part upper face among said one or more side faces.

19. The ceramic electronic component with metal terminal as set forth in claim 18, wherein a plurality of said mounting parts include one mounting part connecting to the joint part including the joint face facing with said one side face, and one other mounting part connecting to the joint part including the joint face facing with said different side face; and said one mounting part and said one other mounting part extends to a direction facing each other.

20. The ceramic electronic component with metal terminal as set forth in claim 13, wherein a plurality of said mounting parts extends from a connecting portion with said joint part towards a portion facing against said at least one chip component.

21. The ceramic electronic component with metal terminal as set forth in claim 13, wherein said at least one chip component is a multilayered chip component with a stacking direction approximately parallel to said mounting part upper face.

22. The ceramic electronic component with metal terminal as set forth in claim 13, wherein said end face of said at least one chip component is bonded by nonconductive adhesive agent with said connecting face of said pair of metal terminal parts.

23. The ceramic electronic component with metal terminal as set forth in claim 13, wherein said at least one chip component is a multilayered ceramic capacitor comprising a dielectric layer and an internal electrode layer.

* * * * *